US012660615B2

(12) United States Patent
Schlepple et al.

(10) Patent No.: US 12,660,615 B2
(45) Date of Patent: Jun. 16, 2026

(54) LOAD PLATE WITH FEEDTHROUGH

(71) Applicant: Cisco Technology, Inc., San Jose, CA (US)

(72) Inventors: Norbert Schlepple, Macungie, PA (US); Vipulkumar K. Patel, Breinigsville, PA (US); Aparna R. Prasad, San Jose, CA (US); Paul Ton, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 519 days.

(21) Appl. No.: 18/182,072

(22) Filed: Mar. 10, 2023

(65) Prior Publication Data

US 2024/0304512 A1      Sep. 12, 2024

(51) Int. Cl.
*G02B 6/38*          (2006.01)
*H10W 40/22*        (2026.01)
*H10W 72/00*        (2026.01)

(52) U.S. Cl.
CPC .......... *H10W 40/22* (2026.01); *G02B 6/3897* (2013.01); *H10W 72/00* (2026.01)

(58) Field of Classification Search
CPC .. G02B 6/4292; G02B 6/3821; G02B 6/3885; G02B 6/3893
See application file for complete search history.

(56) References Cited

U.S. PATENT DOCUMENTS

| | | | |
|---|---|---|---|
| 5,158,912 A | 10/1992 | Kellerman et al. | |
| 9,609,785 B1 | 3/2017 | Babcock et al. | |
| 11,391,897 B2 | 7/2022 | Patel et al. | |
| 2017/0168253 A1* | 6/2017 | Wilcox | G02B 6/4278 |
| 2020/0388548 A1 | 12/2020 | Blackburn et al. | |
| 2021/0329810 A1 | 10/2021 | Goergen | |
| 2021/0385975 A1 | 12/2021 | Nagarajan et al. | |
| 2024/0302613 A1* | 9/2024 | Zhou | G02B 6/42 |

* cited by examiner

*Primary Examiner* — Eva Y Montalvo
(74) *Attorney, Agent, or Firm* — Patterson + Sheridan, LLP

(57)          ABSTRACT

An apparatus includes a substrate, an integrated circuit positioned on the substrate, and a load plate positioned on the integrated circuit such that the load plate is arranged to absorb heat from the integrated circuit. The load plate includes a body and an extender. The body includes an upper surface and a bottom surface. The bottom surface contacts the integrated circuit such that the bottom surface is between the integrated circuit and the upper surface. A portion of the body extends beyond the integrated circuit. The extender is coupled to the portion of the body such that the extender extends from the bottom surface to define a cavity between the extender and the integrated circuit. The extender defines an aperture aligned with the integrated circuit.

16 Claims, 7 Drawing Sheets

100

LOAD PLATE WITH FEEDTHROUGH

TECHNICAL FIELD

Embodiments presented in this disclosure generally relate to load plates for integrated circuits. More specifically, embodiments disclosed herein relate to a load plate with a feedthrough.

BACKGROUND

Load plates may serve as heatsinks for electronic circuits. For example, a load plate may be positioned on an integrated circuit to absorb heat from the integrated circuit during operation. The heat may then be carried by the load plate away from the integrated circuit.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
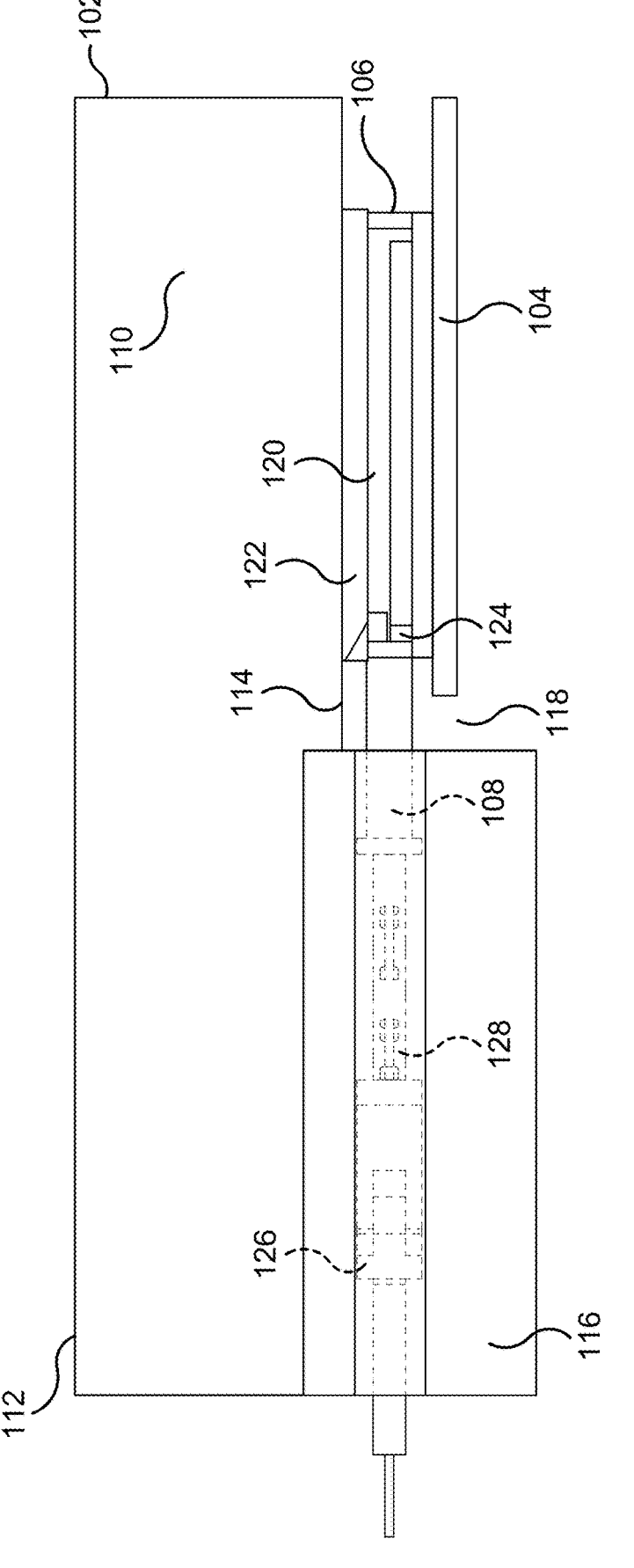
FIGS. 1A, 1B, and 1C illustrate an example system.

According to an embodiment, an apparatus includes a substrate, an integrated circuit positioned on the substrate, and a load plate positioned on the integrated circuit such that the load plate is arranged to absorb heat from the integrated circuit. The load plate includes a body and an extender. The body includes an upper surface and a bottom surface. The bottom surface contacts the integrated circuit such that the bottom surface is between the integrated circuit and the upper surface. A portion of the body extends beyond the integrated circuit. The extender is coupled to the portion of the body such that the extender extends from the bottom surface to define a cavity between the extender and the integrated circuit. The extender defines an aperture aligned with the integrated circuit.

According to another embodiment, a system includes a substrate, an integrated circuit positioned on the substrate, a load plate, and an optical connector. The load plate is positioned on the integrated circuit such that the load plate is arranged to absorb heat from the integrated circuit. The load plate defines (i) a cavity and (ii) an aperture through the load plate and aligned with the integrated circuit. The optical connector extends through the aperture and the cavity and to connect to the integrated circuit.

According to another embodiment, an apparatus includes a load plate body and a load plate extender. The load plate body includes an upper surface and a bottom surface. The bottom surface contacts an integrated circuit such that the bottom surface is between the integrated circuit and the upper surface and such that the load plate body absorbs heat from the integrated circuit. The load plate extender extends from the bottom surface such that when the bottom surface is in contact with the integrated circuit, the load plate extender defines a cavity between the extender and the integrated circuit. The extender defines an aperture aligned with the integrated circuit when the bottom surface is in contact with the integrated circuit.

Example Embodiments

Load plates may serve as heatsinks for electronic circuits. For example, a load plate may be positioned on an integrated circuit (e.g., a photonic integrated circuit) to absorb heat from the integrated circuit during operation. However, when the load plate is positioned on the integrated circuit, it may be challenging to route a connector (e.g., an optical connector) to the integrated circuit. Additionally, even when the connector is successfully routed to the integrated circuit, the connector may lack structural support, which may result in the connector disconnecting from the integrated circuit or not aligning properly with the integrated circuit.

The present disclosure describes a load plate with an optical feedthrough. Generally, the load plate defines an aperture on the side of the load plate through which an optical feedthrough (e.g., an optical connector) may pass. When the load plate is positioned on an integrated circuit, the aperture aligns with the integrated circuit. An optical fiber may then be fed through the aperture and connected to the integrated circuit (e.g., by an optical feedthrough or connector). Additionally, the load plate provides structural or mechanical support for the optical feedthrough when the optical feedthrough is positioned in the aperture. As a result, it may be easier to connect the optical fiber to the integrated circuit, and the load plate may hold the optical feedthrough more securely in place when the optical fiber is connected to the integrated circuit.

Figure 1B:
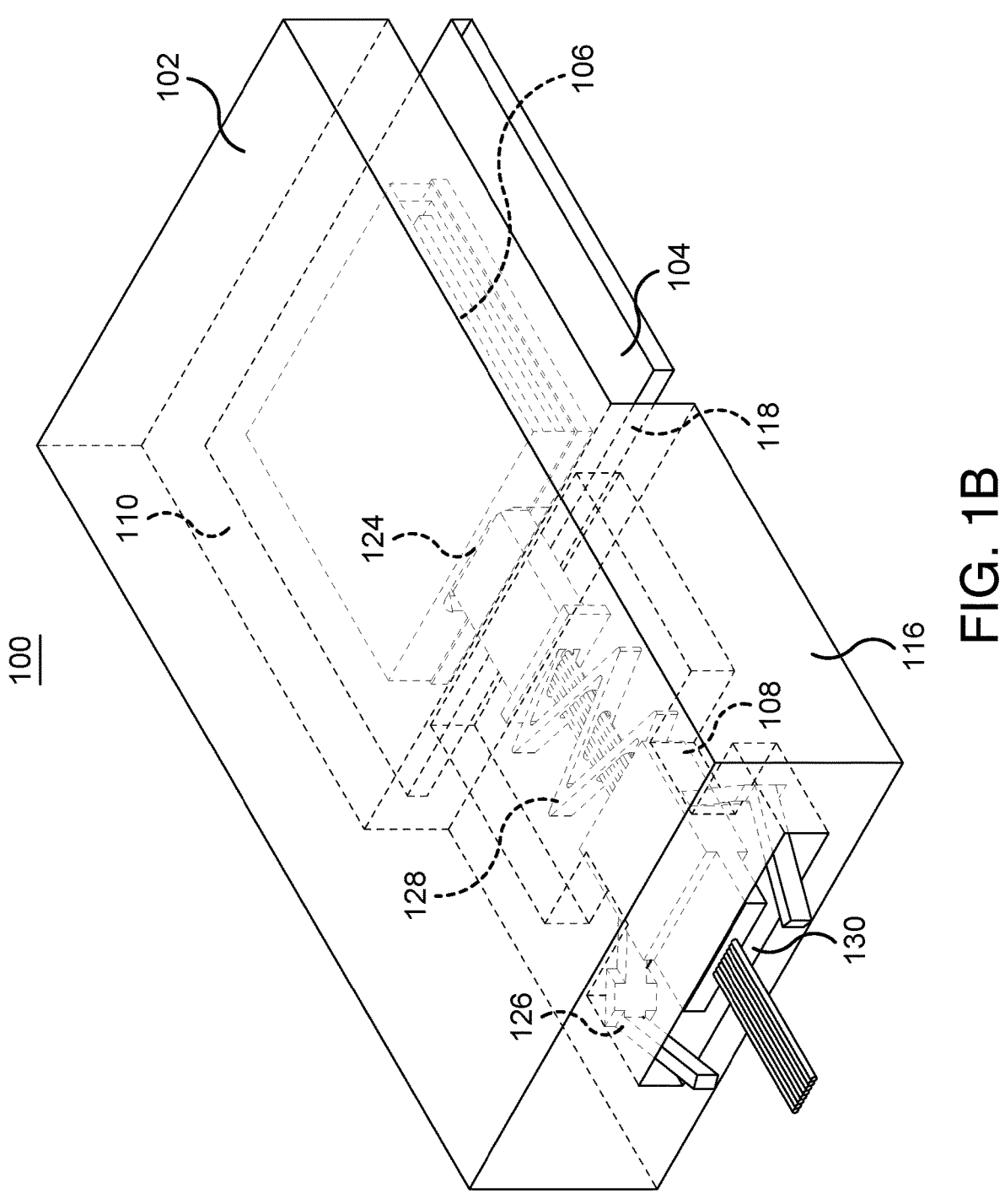
Figure 1C:
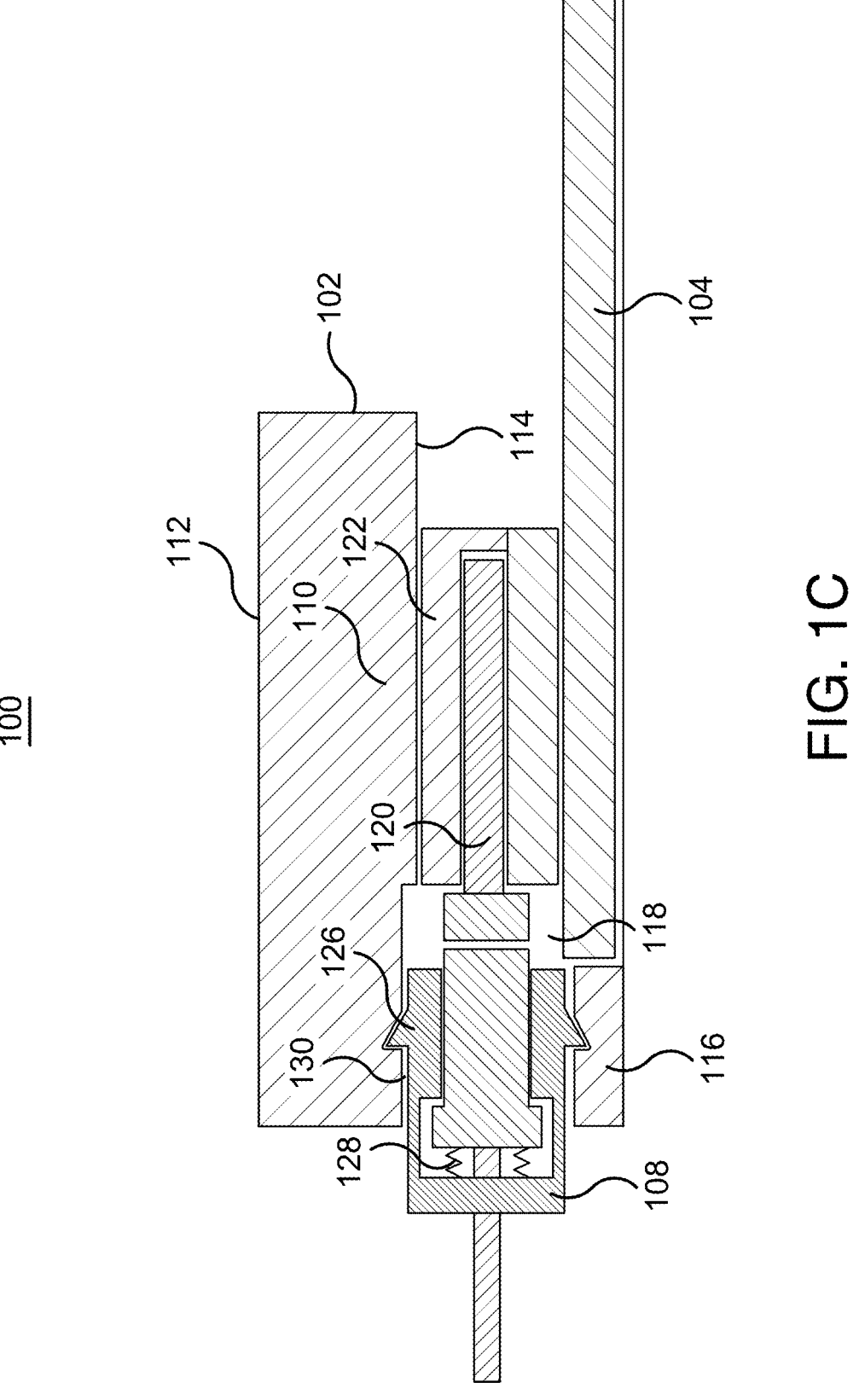

FIGS. 1A, 1B, and 1C illustrate an example system 100. Generally, the system 100 includes a load plate positioned on an integrated circuit. The load plate defines an aperture on the side of the load plate that aligns with the integrated circuit. An optical connector (which may be an example of an optical feedthrough) may be inserted through the aperture to connect with the integrated circuit. As a result, the load plate allows the optical connector to be routed to the integrated circuit. Additionally, the load plate provides structural support for the optical connector when the optical connector is connected to the integrated circuit.

FIG. 1A shows a side view of the system 100. As seen in FIG. 1A, the system 100 includes a load plate 102, a substrate 104, an integrated circuit 106, and an optical connector 108. Generally, the optical connector 108 feeds through the side of the load plate 102 to connect to the integrated circuit 106. The load plate 102 may provide structural support for the optical connector 108 when the optical connector 108 is connected to the integrated circuit 106.

The load plate 102 may be a thermally conducting structure positioned on the integrated circuit 106. For example, the load plate 102 may be a metallic structure (e.g., aluminum, copper, or any other suitable metal or alloy with high thermal conductivity and low coefficient of thermal expansion) that absorbs heat from the integrated circuit 106. The load plate 102 may carry or direct that heat away from the integrated circuit 106, thus controlling the temperature of the integrated circuit 106. Thus, the load plate 102 may apply downwards pressure on the integrated circuit 106, and the load plate 102 may function as a cold plate or heatsink and absorb heat from the integrated circuit 106. As seen in FIG. 1A, the load plate 102 includes a body 110 that is positioned on the integrated circuit 106. The body 110 includes an upper surface 112 and a bottom surface 114 opposite the upper surface 112. The bottom surface 114 may contact the integrated circuit 106. Heat from the integrated circuit 106 may be directed through the bottom surface 114 and towards the upper surface 112. The heat may then be dissipated through the upper surface 112.

The load plate 102 also includes an extender 116 that extends downwards from the bottom surface 114. In some instances, the extender 116 may extend vertically downwards from the bottom surface 114 past the integrated circuit 106. As a result, the extender 116 may extend closer to a bottom of the system 100 than the integrated circuit 106. The extender 116, the body 110, and the integrated circuit 106 may define a cavity 118. The cavity 118 may extend laterally between the extender 116 and the integrated circuit 106.

The substrate 104 may be a material (e.g., a semiconductor material) that provides a foundation for other components of the system 100. As seen in FIG. 1A, the substrate 104 may include one or more layers. Other components of the system 100 may be positioned on or above the substrate 104.

The integrated circuit 106 may be positioned on the substrate 104. The body 110 of the load plate 102 may be positioned on the integrated circuit 106. As seen in FIG. 1A, the integrated circuit 106 may include a photonic integrated circuit 120 and a lid 122. The photonic integrated circuit 120 may be positioned or connected to the substrate 104. The lid 122 may be positioned on or above the photonic integrated circuit 120. In some embodiments, the lid 122 may lift up to open and expose the photonic integrated circuit 120. The lid 122 may also be closed to cover or protect the photonic integrated circuit 120.

An optical feedthrough may provide an optical connection to the integrated circuit 106. In the example of FIG. 1A, the optical feedthrough is an optical connector 108 that provides the optical connection. For example, the optical connector 108 may connect an optical fiber to the integrated circuit 106. The optical fiber and the optical connector 108 may then carry optical signals to the integrated circuit 106. The photonic integrated circuit 120 may also include one or more optical ports 124 (e.g., ferrules) exposed on an outer surface of the photonic integrated circuit 120. The optical connector 108 may connect to an optical port 124 to direct optical signals into the optical port 124. As see in FIG. 1A, the optical port 124 may extend from the photonic integrated circuit 120 into the cavity 118.

The optical connector 108 may be inserted through the extender 116. The extender 116 may define an aperture that extends through the extender 116 and that aligns with the integrated circuit 106 and the optical port 124 of the photonic integrated circuit 120. The aperture may be sized to fit or accommodate the optical connector 108. When the optical connector is inserted or fed through the aperture and the extender 116, the optical connector 108 may be aligned with the integrated circuit 106 or the optical port 124 on the photonic integrated circuit 120. The optical connector 108 may then be pushed through the aperture and towards the integrated circuit 106 such that that optical connector 108 connects to the integrated circuit 106. For example, the optical connector may connect to the optical port 124 on the photonic integrated circuit 120. The optical connector 108 may then deliver optical signals to the integrated circuit 106.

The extender 116 may provide structural support for the optical connector 108 so that the weight of the backend of the optical connector 108 does not pull or separate the optical connector 108 from the integrated circuit 106.

The optical connector 108 may include various mechanisms for securing or holding the optical connector 108 in place to the load plate 102. As see in FIG. 1A, the optical connector 108 may include latches 126 that latch or connect to the load plate 102 when the optical connector 108 is connected to the integrated circuit 106. The latches 126 may engage cutouts or grooves formed in the aperture of the extender 116. The latches 126 may then prevent or resist the optical connector 108 from being disconnected from the integrated circuit 106 and being pulled out from the aperture of the extender 116. Additionally, the optical connector 108 includes a spring 128 that compresses when the optical connector 108 is connected to the integrated circuit 106. The spring 128 may provide a compression force that pushes a front portion of the optical connector 108 towards the integrated circuit 106. Thus, the spring 128 may keep the optical connector 108 securely connected to the integrated circuit 106. In this manner, the latch 126 and the spring 128 help prevent the optical connector 108 from separating or disconnecting from the integrated circuit 106.

FIG. 1B shows an isometric view of the system 100. As see in FIG. 1B, the load plate 102 may be positioned on the integrated circuit 106. Additionally, the optical connector 108 may be fed or inserted through an aperture 130 defined by the extender 116 to connect to the integrated circuit 106.

As discussed previously, the integrated circuit 106 is positioned on the substrate 104. The body 110 of the load plate 102 is then positioned on the integrated circuit 106. The extender 116 extends downwards from the body 110 such that the extender 116 forms the cavity 118 that extends between the extender 116 and the integrated circuit 106. The integrated circuit 106 also includes the optical port 124 that extends from an outer surface of the integrated circuit 106 and into the cavity 118.

The extender 116 defines the aperture 130 on the side of the load plate 102. The aperture 130 may be aligned with an optical port 124 on the integrated circuit 106. The optical connector 108 may pass through the aperture 130 to connect to the optical port 124 of the integrated circuit 106. The optical connector 108 may then deliver optical signals to the optical port 124 of the integrated circuit 106.

The optical connector 108 includes a latch 126 that engages with the extender 116. When the optical connector 108 connects to the integrated circuit 106, the latch 126 may engage with the extender 116 to hold the optical connector 108 in place. so that the optical connector 108 does not pull away or out from the extender 116. A user may press on the latch 126 to disengage the latch 126 from the extender 116. When the latch 126 is disengaged from the extender 116, the user may pull or remove the optical connector 108 from the aperture 130. In this manner, the optical connector 108 disconnects from the integrated circuit 106 and is removed from the aperture 130.

The optical connector 108 also includes the spring 128 that compresses when the optical connector 108 is connected to the integrated circuit 106. Because the latch 126 is engaged with the extender 116 and prevents the optical connector 108 from pulling out or away from the aperture 130, the spring 128 compresses. This compression force pushes a front portion of the optical connector 108 towards the integrated circuit 106, which maintains the connection between the optical connector 108 and the integrated circuit 106. As a result, the spring 128 may help keep the optical connector 108 connected to the integrated circuit 106.

The extender 116 may provide structural support for the optical connector 108 when the optical connector 108 is connected to the integrated circuit 106. For example, the extender 116 may structurally support the weight of a backend of the optical connector 108 so that the weight does not pull or disconnect the optical connector 108 from the integrated circuit 106. In this manner, the extender 116 helps keep the optical connector 108 connected to the integrated circuit 106.

FIG. 1C illustrates a cross-sectional view of the system 100. As seen in FIG. 1C, the optical connector 108 may pass through the aperture 130 and the cavity 118 to connect to the photonic integrated circuit 120.

The photonic integrated circuit 120 may be positioned on the substrate 104. Additionally, the lid 122 may be positioned on or above the photonic integrated circuit 120. The body 110 of the load plate 102 may be positioned on the lid 122. The body 110 may then absorb heat from the photonic integrated circuit 120 through the bottom surface 114. The body 110 may then dissipate that heat through the upper surface 112. The extender 116 may extend downwards from the bottom surface 114 of the body 110. The extender 116 may extend past the photonic integrated circuit 120 and define the cavity 118. The cavity 118 may extend laterally between the extender 116 and the photonic integrated circuit 120. The extender 116 may also define the aperture 130. The aperture 130 may be aligned with the photonic integrated circuit 120. The optical connector 108 may pass through the aperture 130 and the cavity 118 to connect to the photonic integrated circuit 120.

The optical connector 108 may include latches 126 that engage with dents, grooves, or cutouts in the load plate 102 when the optical connector 108 is connected to the photonic integrated circuit 120. When engaged, the latches 126 may prevent the optical connector 108 from pulling out or away from the aperture 130.

The optical connector 108 may also include a spring 128 that compresses when the optical connector 108 is connected to the photonic integrated circuit 120. The spring 128 exerts a compression force that pushes a front portion of the optical connector 108 towards the photonic integrated circuit 120, which keeps the optical connector 108 connected to the photonic integrated circuit 120.

Additionally, the extender 116 provides structural support for the optical connector 108. Specifically, the extender 116 may support the weight of a back portion of the optical connector 108, so that the weight does not pull the optical connector 108 away from the photonic integrated circuit 120.

Figure 2A:
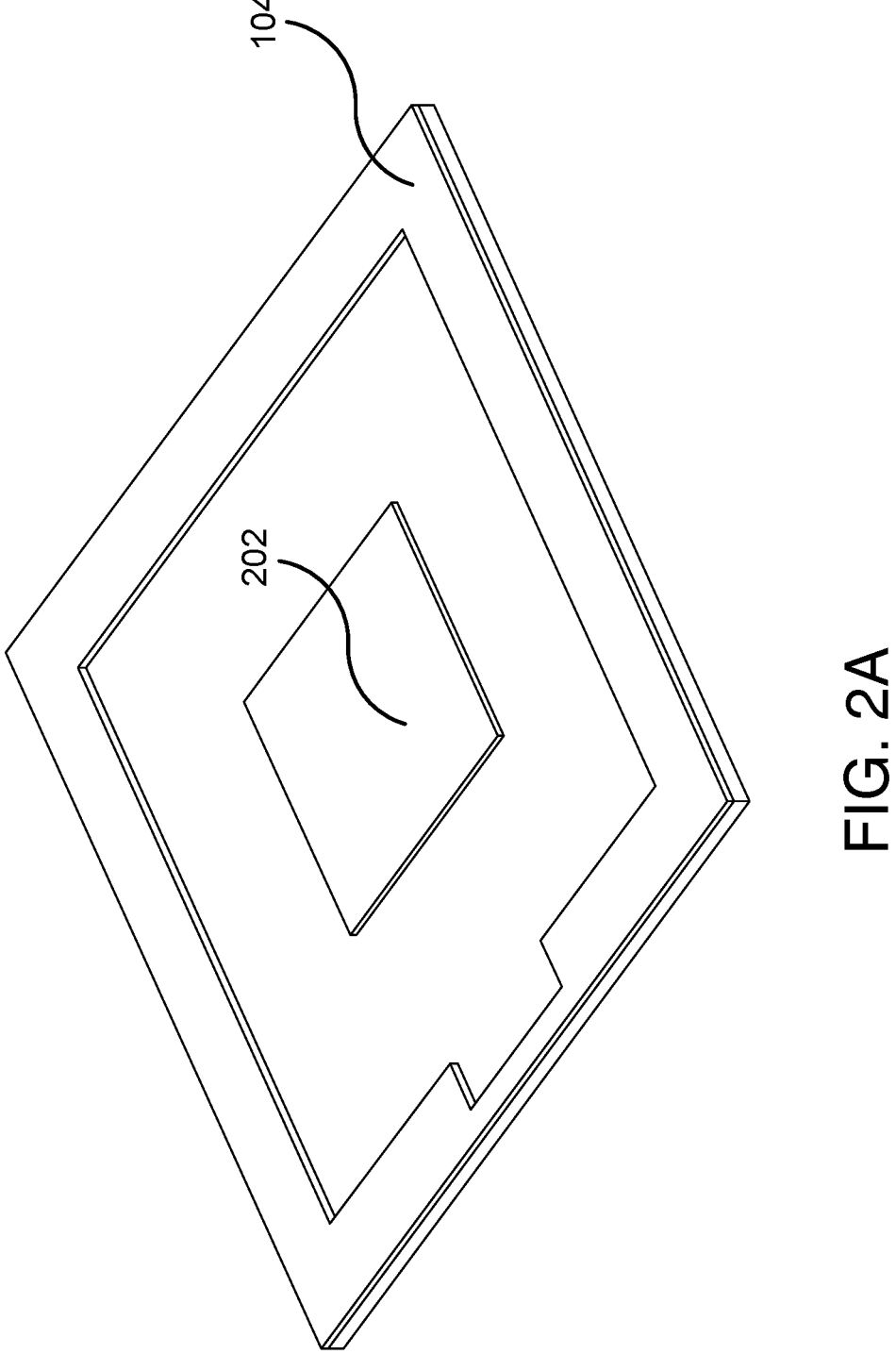
FIGS. 2A, 2B, 2C, and 2D illustrate a process for forming the system of FIGS. 1A, 1B, and 1C.

FIGS. 2A, 2B, 2C, and 2D illustrate a process for forming the system 100 of FIGS. 1A, 1B, and 1C. As seen in FIG. 2A, the process begins with the substrate 104, which may be any suitable material (e.g., a semiconductor material). Any suitable components may be positioned on the substrate 104. In the example of FIG. 2A, an integrated circuit 202, which may be an application specific integrated circuit, may be positioned on the substrate 104.

Figure 2B:
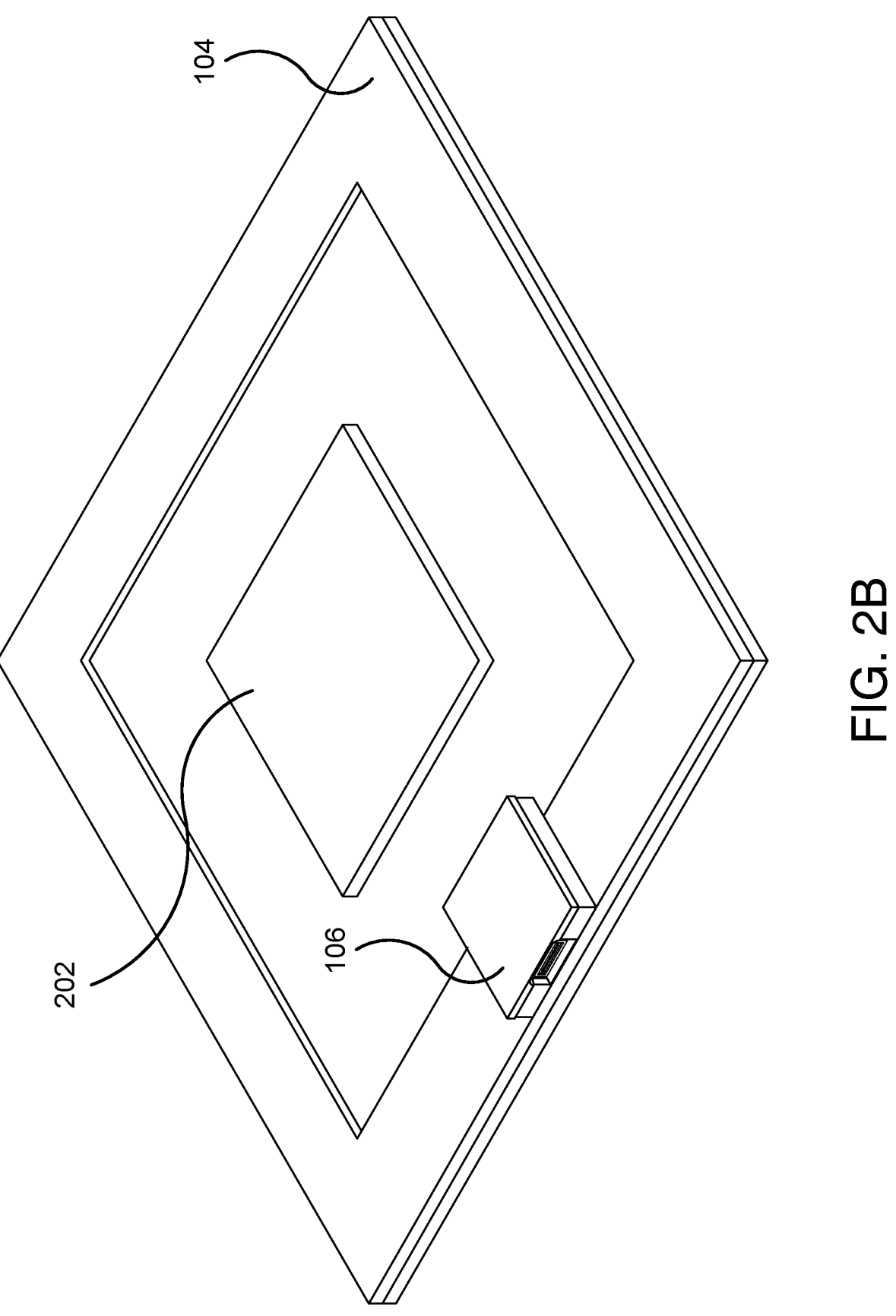

As seen in FIG. 2B, after the integrated circuit 202 is positioned on the substrate 104, the integrated circuit 106 is positioned on the substrate 104. The integrated circuit 106 may include the photonic integrated circuit 120. The photonic integrated circuit may convert a received optical signal into an electric signal. The integrated circuit 106 may communicate the electric signal to the integrated circuit 202.

The integrated circuit 202 may then analyze or process information in the electric signal to perform certain actions or functions.

Figure 2C:
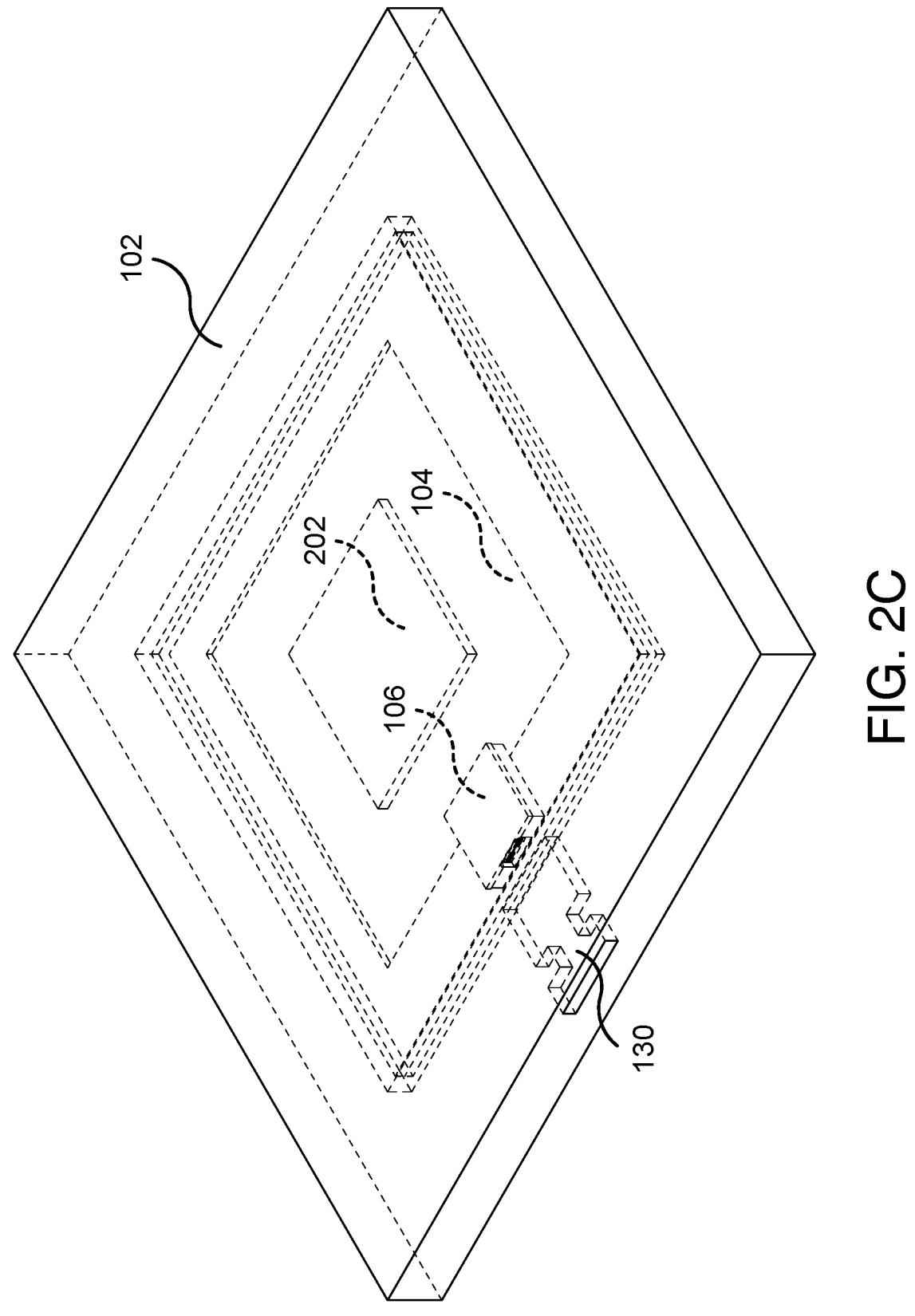

As seen in FIG. 2C, after the integrated circuit 202 and the integrated circuit 106 are positioned on the substrate 104, the load plate 102 is positioned on the integrated circuit 106 and the integrated circuit 202. The load plate 102 may be a thermally conducting structure that absorbs heat from the integrated circuit 106 and the integrated circuit 202. The load plate 102 may then carry that heat away from the integrated circuit 106 and the integrated circuit 202 and dissipate that heat. Thus, the load plate 102 may apply downwards pressure on the integrated circuit 106, and the load plate 102 may function as a cold plate or heatsink and absorb heat from the integrated circuit 106. Additionally, as seen in FIG. 2C, the load plate 102 defines an aperture 130. The aperture 130 may be aligned with the integrated circuit 106 when the load plate 102 is positioned on the integrated circuit 106.

Figure 2D:
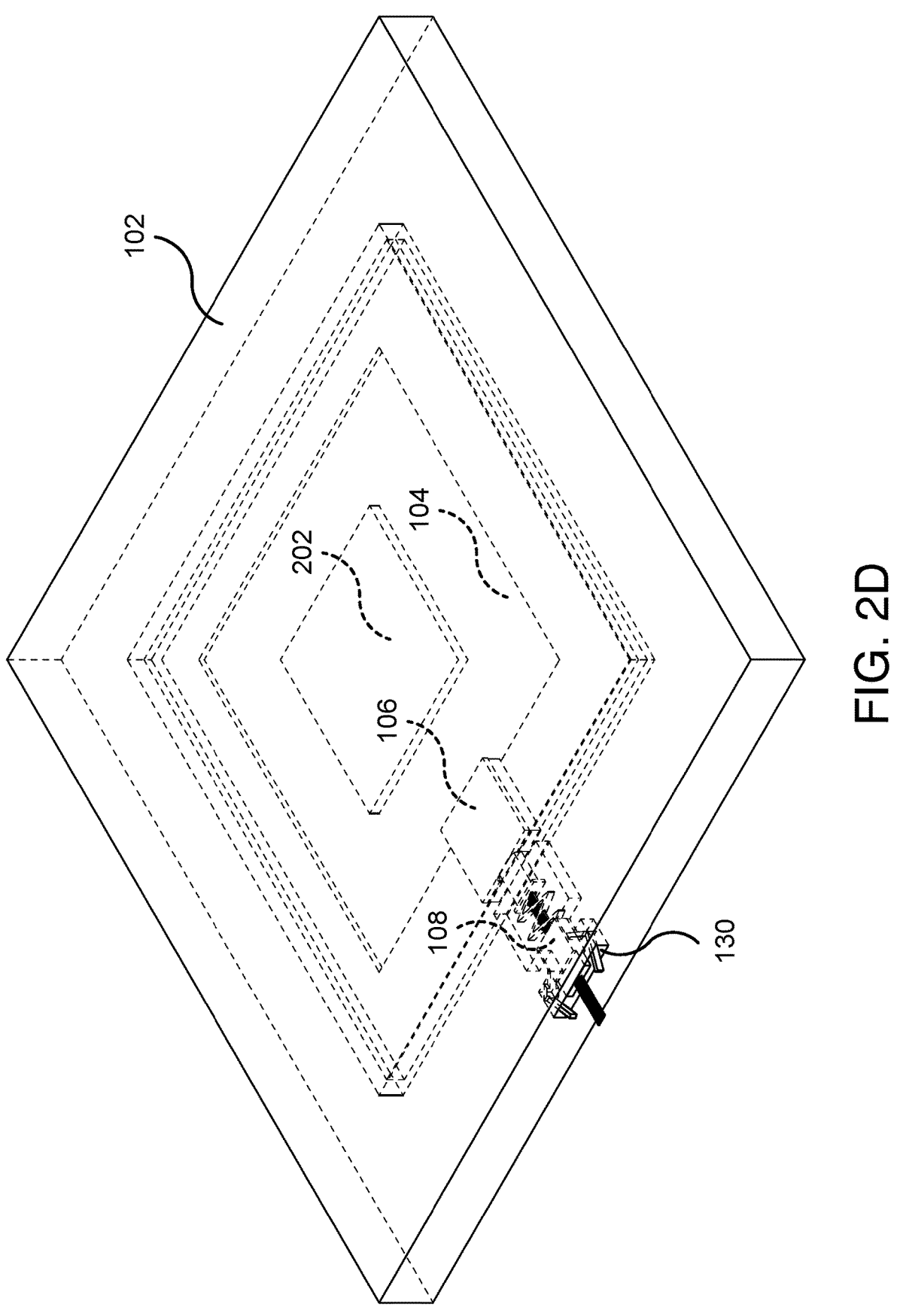

An optical feedthrough may then be fed through the aperture 130. As seen in FIG. 2D, an optical connector 108 is inserted or fed through the aperture 130. Because the aperture 130 is aligned with the integrated circuit 106, the aperture 130 may align the optical connector 108 with the integrated circuit 106 when the optical connector 108 is inserted or fed through the aperture 130. The optical connector 108 may then connect to the integrated circuit 106. The load plate 102 may provide structural support for the optical connector 108. For example, the load plate 102 may provide structural support for the weight of a back portion of the optical connector 108 so that the weight does not pull the optical connector 108 away from the aperture 130 or the integrated circuit 106. Thus, the load plate 102 helps keep the optical connector 108 aligned and connected properly with the integrated circuit 106.

In some embodiments, the load plate 102 and the optical connector 108 include other features that help keep the optical connector 108 aligned and connected properly with the integrated circuit 106. For example, the optical connector 108 may include latches 126 that engage with cutouts, dents, or grooves in the load plate 102. When the latches 126 are engaged with the cutouts, dents, or grooves, the latches 126 prevent the optical connector 108 from pulling out or away from the aperture 130 and disconnecting from the integrated circuit 106. Additionally, the optical connector 108 may include a spring 128 that compresses when the optical connector 108 is connected to the integrated circuit 106. The spring 128 may provide a compression force that pushes a front portion of the optical connector 108 towards the integrated circuit 106, which keeps the optical connector 108 connected properly with the integrated circuit 106.

The optical connector 108 may connect an optical fiber to the integrated circuit 106. The optical fiber and the optical connector 108 may carry an optical signal to the integrated circuit 106. The integrated circuit 106 may convert the optical signal into an electric signal. The integrated circuit 106 may then communicate the electric signal to the integrated circuit 202. The integrated circuit 202 may use the information in the electric signal to perform certain actions or features. In some embodiments, the integrated circuit 202 may communicate an electric signal to the integrated circuit 106. The integrated circuit 106 may convert the electric signal to an optical signal. The integrated circuit 106 may then communicate the optical signal through the optical connector 108 and the optical fiber. Because the load plate 102 provides structural support for the optical connector 108, the load plate 102 helps maintain the optical connection between the optical connector 108 and the integrated circuit 106, in addition to absorbing and removing heat from the integrated circuit 106.

In summary, an optical system 100 includes a load plate 102 with a feedthrough that accommodates an optical connector 108. Generally, the load plate 102 defines an aperture 130 on the side of the load plate 102 that serves as the feedthrough for an optical connector 108. When the load plate 102 is positioned on an integrated circuit 106, the aperture 130 aligns with the integrated circuit 106. The optical connector 108 may then be fed through the aperture 130 and connected to the integrated circuit 106. Additionally, the load plate 102 provides structural or mechanical support for the optical connector 108 when the optical connector 108 is positioned in the aperture 130. As a result, it may be easier to connect the optical connector 108 to the integrated circuit 106, and the load plate 102 may hold the optical connector 108 more securely in place when the optical connector 108 is connected to the integrated circuit 106.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. An apparatus comprising:
a substrate;
an integrated circuit positioned on the substrate; and
a load plate positioned on the integrated circuit such that the load plate is arranged to absorb heat from the integrated circuit, wherein the load plate comprises:
   a body comprising an upper surface and a bottom surface, wherein the bottom surface contacts the integrated circuit such that the bottom surface is between the integrated circuit and the upper surface, wherein a portion of the body extends beyond the integrated circuit; and
   an extender coupled to the portion of the body such that the extender extends from the bottom surface and past the integrated circuit to define a cavity between the extender and the integrated circuit, wherein the extender defines an aperture that extends through the extender and that is aligned with the cavity and the integrated circuit such that the cavity is positioned between the aperture and the integrated circuit, and wherein the extender defines a groove in the aperture arranged to engage an optical feedthrough to maintain a position of the optical feedthrough as the optical feedthrough passes through the aperture and the cavity to connect to the integrated circuit.

2. The apparatus of claim 1, wherein the optical feedthrough comprises a latch that engages the groove.

3. The apparatus of claim 1, wherein the optical feedthrough comprises a spring arranged to exert a force that maintains a connection between the optical feedthrough and the integrated circuit.

4. The apparatus of claim 1, wherein the integrated circuit comprises an optical port, and wherein the aperture is aligned with the integrated circuit such that an optical feedthrough can pass through the aperture and the cavity to connect to the optical port.

5. The apparatus of claim 1, wherein the integrated circuit comprises a photonic integrated circuit and a lid, and wherein the lid is positioned between the photonic integrated circuit and the load plate.

6. The apparatus of claim 1, wherein the extender extends from the bottom surface past the integrated circuit.

7. A system comprising:
a substrate;
an integrated circuit positioned on the substrate;
a load plate comprising (i) a body comprising an upper surface and a bottom surface and (ii) an extender, wherein the bottom surface is connected to the integrated circuit such that the bottom surface is between the integrated circuit and the upper surface, wherein a portion of the body extends beyond the integrated circuit, wherein the extender is coupled to the portion of the body such that the extender extends from the bottom surface and past the integrated circuit, wherein the load plate is positioned on the integrated circuit such that the load plate is arranged to absorb heat from the integrated circuit, and wherein the extender defines (i) a cavity between the extender and the integrated circuit and (ii) an aperture that extends through the extender and that is aligned with the cavity and the integrated circuit such that the cavity is positioned between the aperture and the integrated circuit; and
an optical connector arranged to extend through the aperture and the cavity and to connect to the integrated circuit, wherein the extender defines a groove in the aperture arranged to engage the optical connector to maintain a position of the optical connector as the optical connector passes through the aperture and the cavity to connect to the integrated circuit.

8. The system of claim 7, wherein the optical connector comprises a latch that engages the groove to maintain a position of the optical connector.

9. The system of claim 7, wherein the optical connector comprises a spring arranged to exert a force that maintains a connection between the optical connector and the integrated circuit.

10. The system of claim 7, wherein the integrated circuit comprises an optical port, and wherein the optical connector connects to the optical port.

11. The system of claim 7, wherein the integrated circuit comprises a photonic integrated circuit and a lid, and wherein the lid is positioned between the photonic integrated circuit and the load plate.

12. A method comprising:
positioning an integrated circuit onto a substrate;
positioning a body of a load plate onto the integrated circuit such that (i) an extender of the load plate coupled to the body defines a cavity between the extender and the integrated circuit and (ii) an aperture that extends through the extender aligns with the cavity and the integrated circuit such that the cavity is positioned between the aperture and the integrated circuit; and inserting an optical connector through the aperture and the cavity to connect the optical connector to the integrated circuit, wherein the extender defines a groove in the aperture arranged to engage the optical connector to maintain a position of the optical connector as the optical connector passes through the aperture and the cavity to connect to the integrated circuit.

13. The method of claim 12, wherein the optical connector comprises a latch that engages the groove.

14. The method of claim 12, wherein the optical connector comprises a spring arranged to exert a force that maintains a connection between the optical connector and the integrated circuit.

15. The method of claim 12, wherein the integrated circuit comprises an optical port, and wherein the aperture is aligned with the integrated circuit such that an optical connector can pass through the aperture and the cavity to connect to the optical port.

16. The method of claim 12, wherein the integrated circuit comprises a photonic integrated circuit and a lid, and wherein the lid is positioned between the photonic integrated circuit and the load plate.

* * * * *